United States Patent
Peterson et al.

(10) Patent No.: US 11,715,895 B2
(45) Date of Patent: Aug. 1, 2023

(54) METHODS FOR MAKING ELECTRICAL CONNECTORS WITH AN ELECTRICAL INTERPOSER

(71) Applicant: Seagate Technology LLC, Fremont, CA (US)

(72) Inventors: Michael J. Peterson, Prior Lake, MN (US); Michael R. Fabry, Apple Valley, MN (US); Sean M. Horgan, Shakopee, MN (US); John F. Fletcher, Longmont, CO (US); William B. Green, Shakopee, MN (US)

(73) Assignee: Seagate Technology LLC, Fremont, CA (US)

( * ) Notice: Subject to any disclaimer, the term of this patent is extended or adjusted under 35 U.S.C. 154(b) by 322 days.

(21) Appl. No.: 16/925,020

(22) Filed: Jul. 9, 2020

(65) Prior Publication Data

US 2022/0013940 A1    Jan. 13, 2022

(51) Int. Cl.
| | | |
|---|---|---|
| *H01R 12/71* | (2011.01) | |
| *G11B 25/04* | (2006.01) | |
| *H01R 12/79* | (2011.01) | |
| *H05K 3/34* | (2006.01) | |
| *H05K 1/11* | (2006.01) | |

(52) U.S. Cl.
CPC ......... *H01R 12/716* (2013.01); *G11B 25/043* (2013.01); *H01R 12/79* (2013.01); *H05K 1/113* (2013.01); *H05K 3/3426* (2013.01); *H05K 3/3494* (2013.01); *H05K 2201/10378* (2013.01); *Y10T 29/49002* (2015.01)

(58) Field of Classification Search
CPC .... H01R 12/716; H01R 12/79; G11B 25/043; H05K 1/113; H05K 3/3426; H05K 3/3494; H05K 2201/10378; Y10T 29/49002
USPC .......................................... 324/756
See application file for complete search history.

(56) References Cited

U.S. PATENT DOCUMENTS

| | | | |
|---|---|---|---|
| 6,010,061 A * | 1/2000 | Howell | ............... B23K 1/0016 228/180.21 |
| 6,142,357 A * | 11/2000 | Howell | ............... H05K 3/3468 118/406 |
| 6,617,681 B1 | 9/2003 | Bohr | |
| 7,137,196 B2 | 11/2006 | Gunderson et al. | |
| 9,331,043 B1 | 5/2016 | Katkar et al. | |
| 10,069,653 B1 * | 9/2018 | Derras | ............... H04L 25/0305 |
| 10,383,225 B1 | 8/2019 | Peterson et al. | |
| 2012/0112779 A1 | 5/2012 | Smith et al. | |
| 2014/0167267 A1 | 6/2014 | Uzoh et al. | |
| 2015/0129646 A1 | 5/2015 | Haba et al. | |
| 2015/0129647 A1 | 5/2015 | Haba et al. | |

(Continued)

*Primary Examiner* — Peter Dungba Vo
*Assistant Examiner* — Azm A Parvez
(74) *Attorney, Agent, or Firm* — Faegre Drinker Biddle & Reath LLP

(57) ABSTRACT

A method for manufacturing electrical connector assemblies is disclosed. The electrical connector assemblies include an electrical interposer and a first electrical receptacle. The method includes positioning a fixture coupled to or including an array of the first electrical receptacles such that each of the first electrical receptacles aligns with one of the electrical interposers on an assembly with an array of the electrical interposers. The method further includes reflowing solder to mechanically and electrically couple the array of the first electrical receptacles to the array of the electrical interposers.

19 Claims, 13 Drawing Sheets

(56) References Cited

U.S. PATENT DOCUMENTS

2015/0255364 A1    9/2015   Gao
2015/0262910 A1    9/2015   Sun et al.
2016/0343646 A1   11/2016   Alvarado et al.
2018/0006391 A1*   1/2018   Alcorn ................ H01R 12/778

* cited by examiner

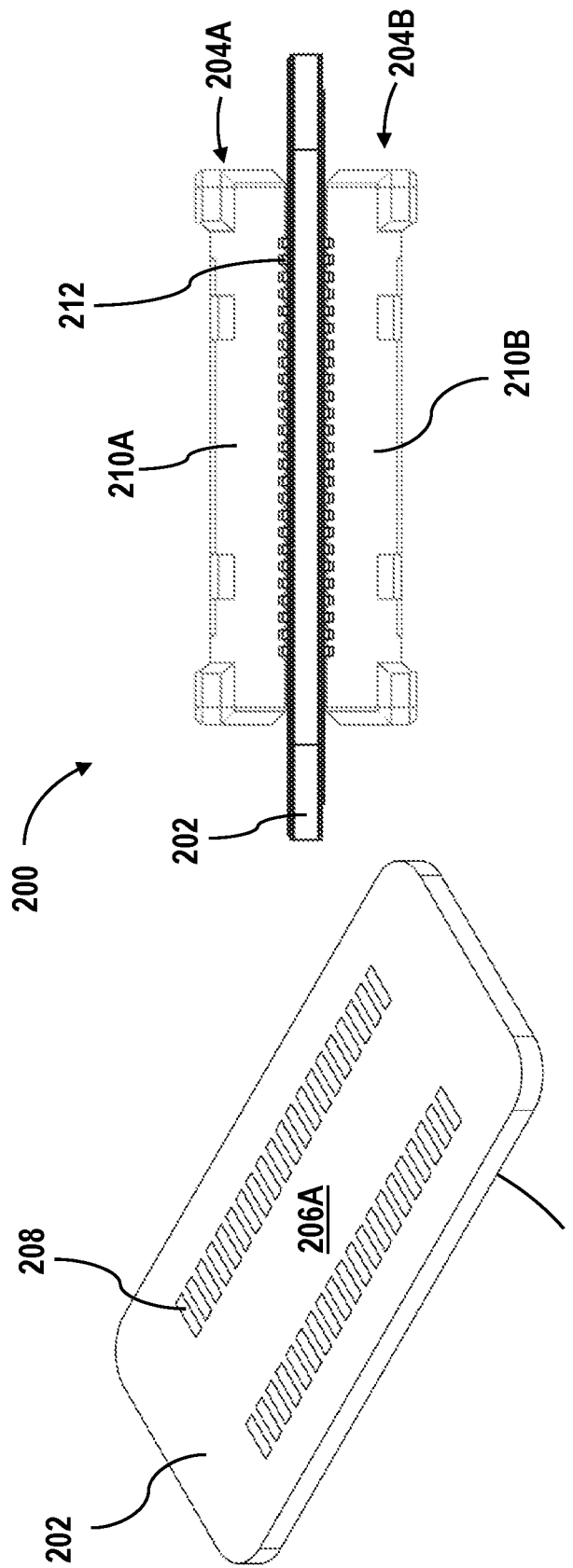

METHODS FOR MAKING ELECTRICAL CONNECTORS WITH AN ELECTRICAL INTERPOSER

SUMMARY

In certain embodiments, a method for manufacturing electrical connector assemblies is disclosed. The electrical connector assemblies include an electrical interposer and a first electrical receptacle. The method includes positioning a fixture coupled to or including an array of the first electrical receptacles such that each of the first electrical receptacles aligns with one of the electrical interposers on an assembly with an array of the electrical interposers. The method further includes reflowing solder to mechanically and electrically couple the array of the first electrical receptacles to the array of the electrical interposers.

In certain embodiments, an assembly includes a fixture with a first frame coupled to or including an array of first electrical receptacles and a second frame coupled to or including an array of second electrical receptacles. The second frame is movable between an open position and a closed position with respect to the first frame.

In certain embodiments, an assembly includes an array of four to twenty electrical interposers, which have an array of conductive pads.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 4 shows a perspective view of an electrical interposer, in accordance with certain embodiments of the present disclosure.

FIGS. 5 and 6 show side views of the electrical connector assembly of FIG. 2, in accordance with certain embodiments of the present disclosure.

Figure 1:
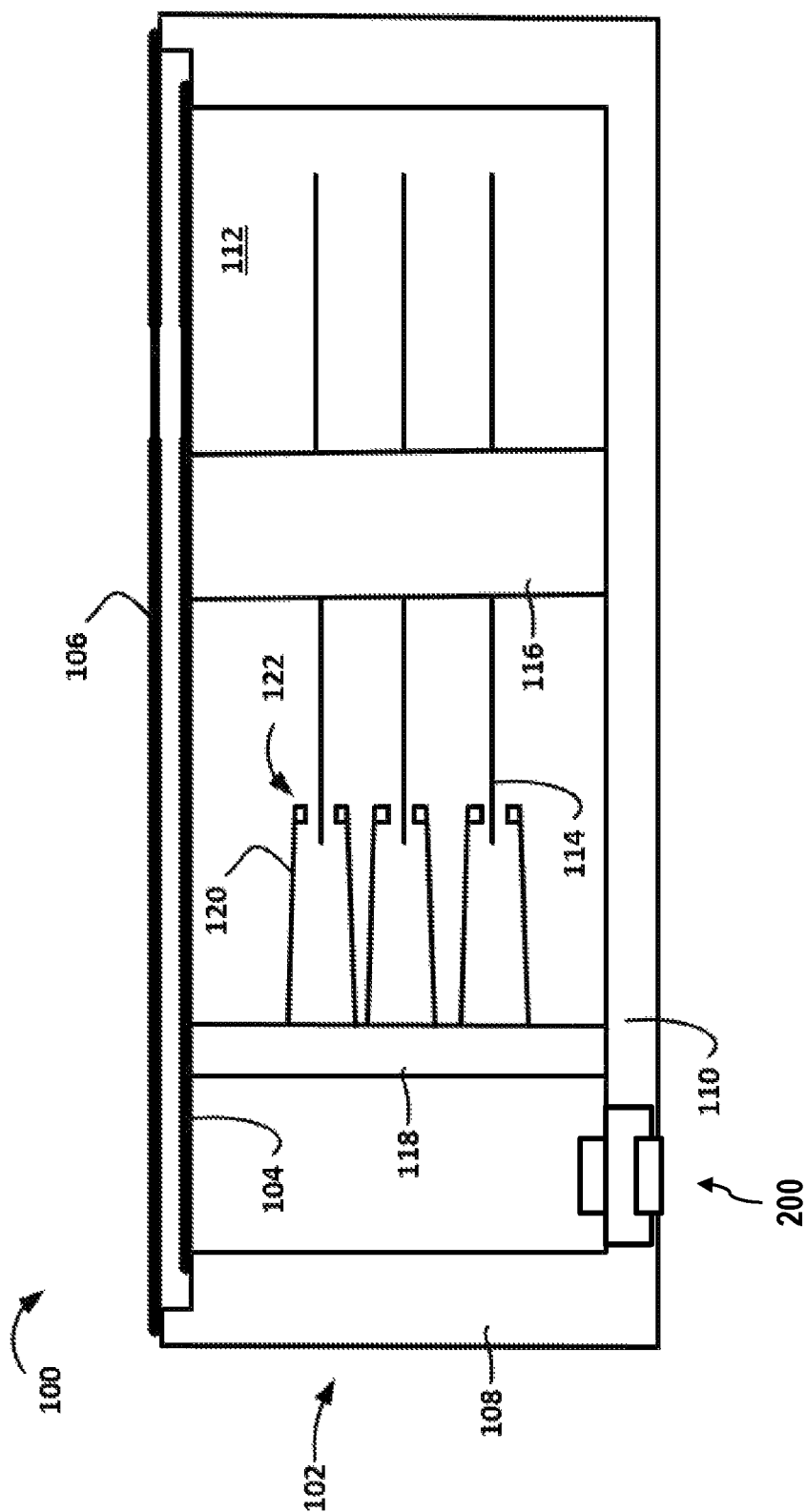
FIG. 1 shows a side cutaway schematic view of a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage devices such as hard disk drives can be filled a low-density gas (as compared to air) such as helium and sealed. One challenge with helium-filled hard disk drives is helium leakage through gaps or passages in the hard disk drives. Such gaps or passages can occur at interfaces between components that form the outer shell of the hard disk drives. For example, the interfaces between base decks and electrical connectors mounted to the base decks can be one source of helium leakage. Electrical connectors with electrical interposers can be used for electrically connecting internal electrical components and external electrical components while also helping to maintain a sealed enclosure. As will be described in more detail, it can be challenging to manufacture such electrical connectors. Certain embodiments of the present disclosure are accordingly directed to methods and devices for manufacturing electrical connectors.

FIG. 1 shows a cut away side view of a hard disk drive 100 including a base deck 102, a process cover 104, and a final cover 106. The base deck 102 includes side walls (e.g., side wall 108) that, together with a bottom portion 110 of the base deck 102 and the process cover 104, creates an internal cavity 112 that may house data storage components like magnetic recording media 114, a spindle motor 116, an actuator pivot 118, suspensions 120, and read/write heads 122. The spindle motor 116 and the actuator pivot 118 are shown in FIG. 1 as being coupled between the process cover 104 and the bottom portion 110 of the base deck 102. The hard disk drive 100 also includes an electrical connector assembly 200 that facilitates communication of electrical signals to and from electrical components external to the hard disk drive 100 and electrical components positioned within the internal cavity 112.

During assembly, the process cover 104 can be coupled to the base deck 102 by removable fasteners and a gasket to seal a target gas (e.g., air with nitrogen and oxygen and/or a lower-density gas like helium) within the internal cavity 112. Once the process cover 104 is coupled to the base deck 102, a target gas may be injected into the internal cavity 112 through an aperture in the process cover 104, which is subsequently sealed. Injecting the target gas, such as a combination of air and a low-density gas like helium (e.g., 90 percent or greater helium), may involve first evacuating existing gas from the internal cavity 112 using a vacuum and then injecting the target gas from a low-density gas supply reservoir into the internal cavity 112. Once the process cover 104 is sealed, the hard disk drive 100 can be subjected to a variety of processes and tests. When such processes and tests are complete, the final cover 106 can be coupled (e.g., welded) to the base deck 102.

Figure 2:
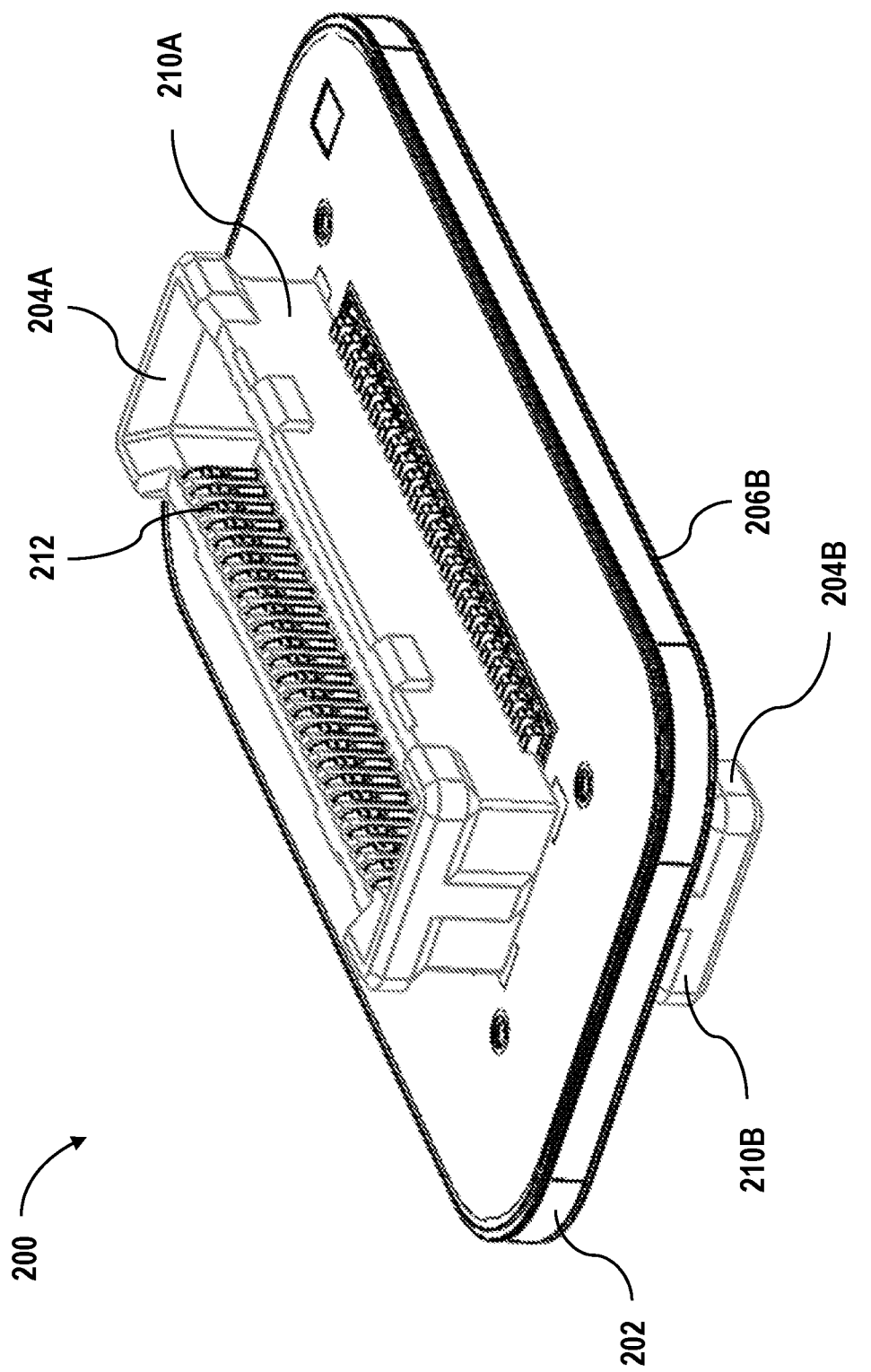
FIG. 2 shows a perspective view of an electrical connector assembly, in accordance with certain embodiments of the present disclosure.
Figure 3:
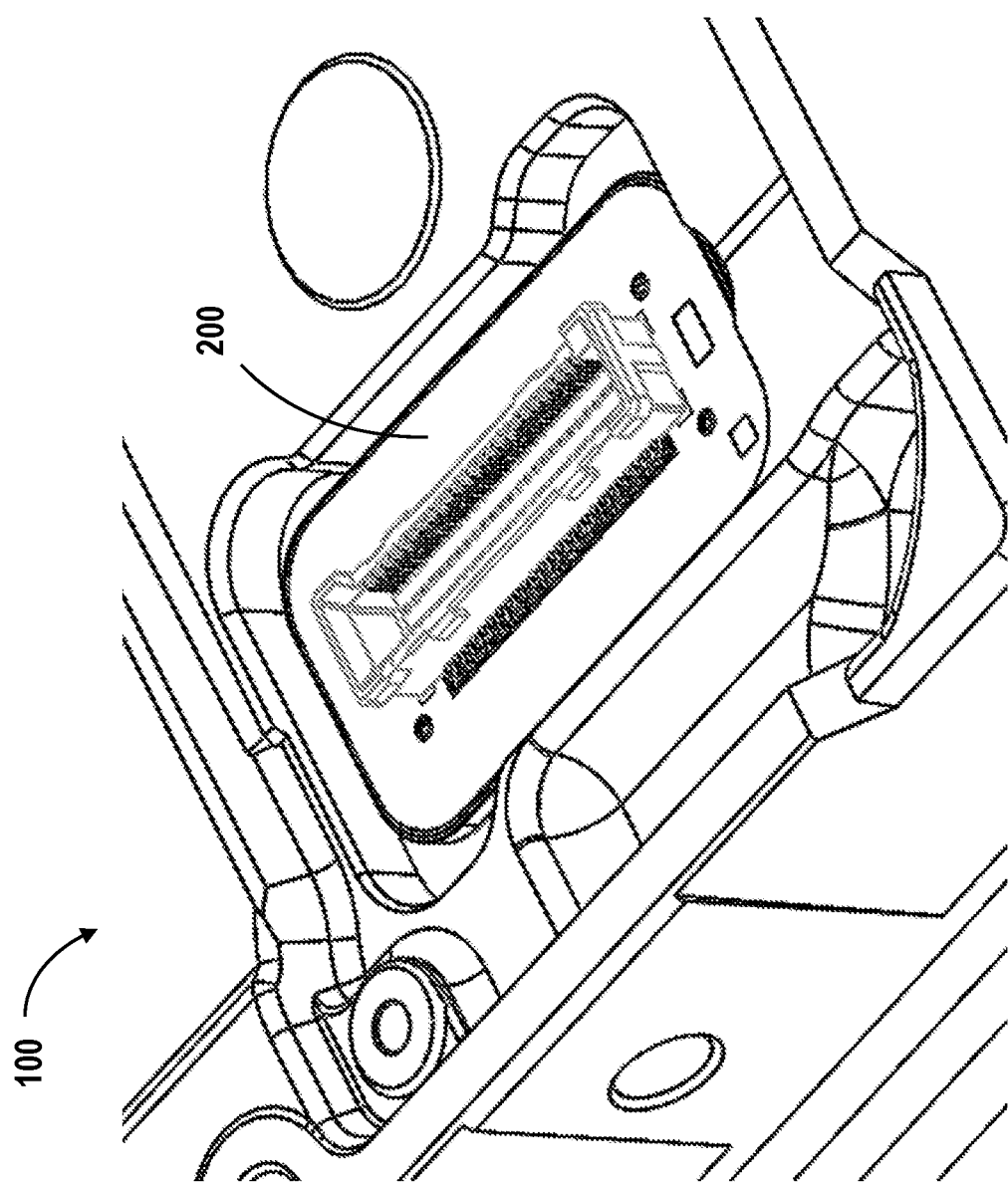
FIG. 3 shows a perspective view of the electrical connector assembly of FIG. 2 installed in the data storage device of FIG. 1, in accordance with certain embodiments of the present disclosure.
Figure 7:
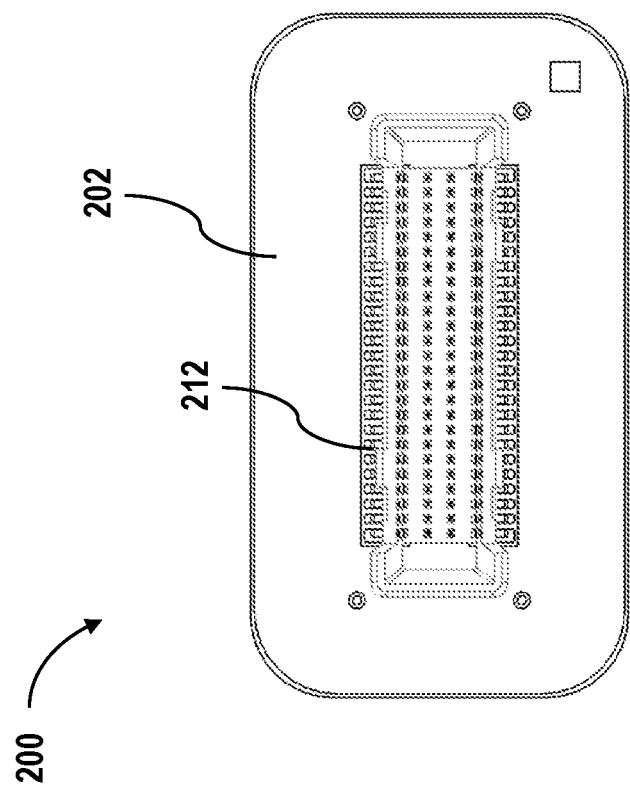
FIG. 7 shows a top view of the electrical connector assembly of FIG. 2, in accordance with certain embodiments of the present disclosure.
Figure 6:
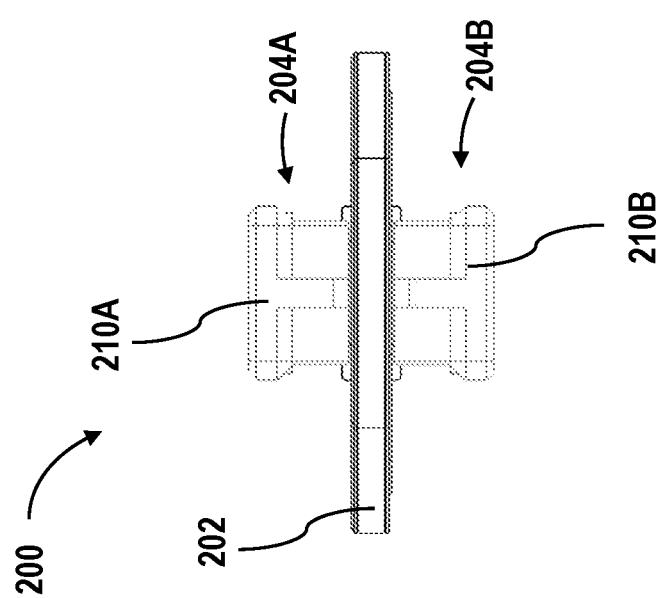

FIG. 2 shows a perspective view of the electrical connector assembly 200, and FIG. 3 shows the electrical connector assembly 200 positioned coupled to the bottom portion 110 of the base deck 102. FIG. 4 shows an electrical interposer 202, which is a component of the electrical connector assembly 200. FIGS. 5-7 show various other views of the electrical connector assembly 200.

As shown in FIGS. 2, 5, and 6, the electrical connector assembly 200 includes the electrical interposer 202, which is coupled to and positioned between a first electrical receptacle 204A and a second electrical receptacle 204B. The electrical interposer 202 is the part of the electrical connector assembly 200 that is positioned within an opening in the bottom portion 110 of the base deck 102 and coupled (e.g., via welding, epoxy, and the like) to the base deck 102. Example electrical interposers are shown and described in U.S. Pat. No. 10,383,225, which is hereby incorporated by reference in its entirety. The electrical interposer 202 includes a top surface 206A and a bottom surface 206B each with sets of conductive pads.

FIG. 4 shows the electrical interposer 202 with conductive pads 208 positioned along the top surface 206A. The conductive pads 208 can be electrically and communicatively coupled to respective conductive pads positioned along the bottom surface 206B by conductive vias. For example, if the top surface 206A included 40 conductive pads 208, the bottom surface 206B could also have its own 40 conductive pads each electrically and communicatively coupled to one of the 40 conductive pads 208 of the top surface 206A by a respective conductive via. As such, the electrical interposer 202 can transmit electrical signals (e.g., data signals and power signals) to and from the hard disk drive 100.

Referring back to FIGS. 2 and 5, the first electrical receptacle 204A and the second electrical receptacle 204B each include a body (e.g., a first body 210A and a second body 210B) and electrical conductors 212 (e.g., conductive pins, conductive contacts) coupled to the bodies 210A and 210B. The electrical conductors 212 electrically and mechanically couple to respective conductive pads of the electrical interposer 202. For example, as will be described in more detail below, the electrical conductors 212 of the first electrical receptacle 204A and the second electrical receptacle 204B can be soldered to the conductive pads 208 of the electrical interposer 202.

The first electrical receptacle 204A is arranged to mechanically and electrically couple to an electrical connector positioned within the internal cavity 112 of the hard disk drive 100. For example, the electrical connector can at least partially extend into a central opening of the first electrical receptacle 204A and mechanically couple to the first body 210A and electrically couple to respective electrical conductors 212. Similarly, the second electrical receptacle 204B is arranged to mechanically and electrically couple to an electrical connector positioned outside the hard disk drive 100. For example, the hard disk drive 100 can include a printed circuit board that is attached to the outside of the base deck 102 and includes an electrical connector shaped to connect to the second electrical receptacle 204B.

As mentioned above, manufacturing the electrical connector assembly 200 can be challenging. In particular, it can be challenging to align the first electrical receptacle 204A and the second electrical receptacle 204B with the electrical interposer 202 such that the respective electrical conductors 212 are aligned with respective conductive pads 208 of the electrical interposer 202.

Figure 8:
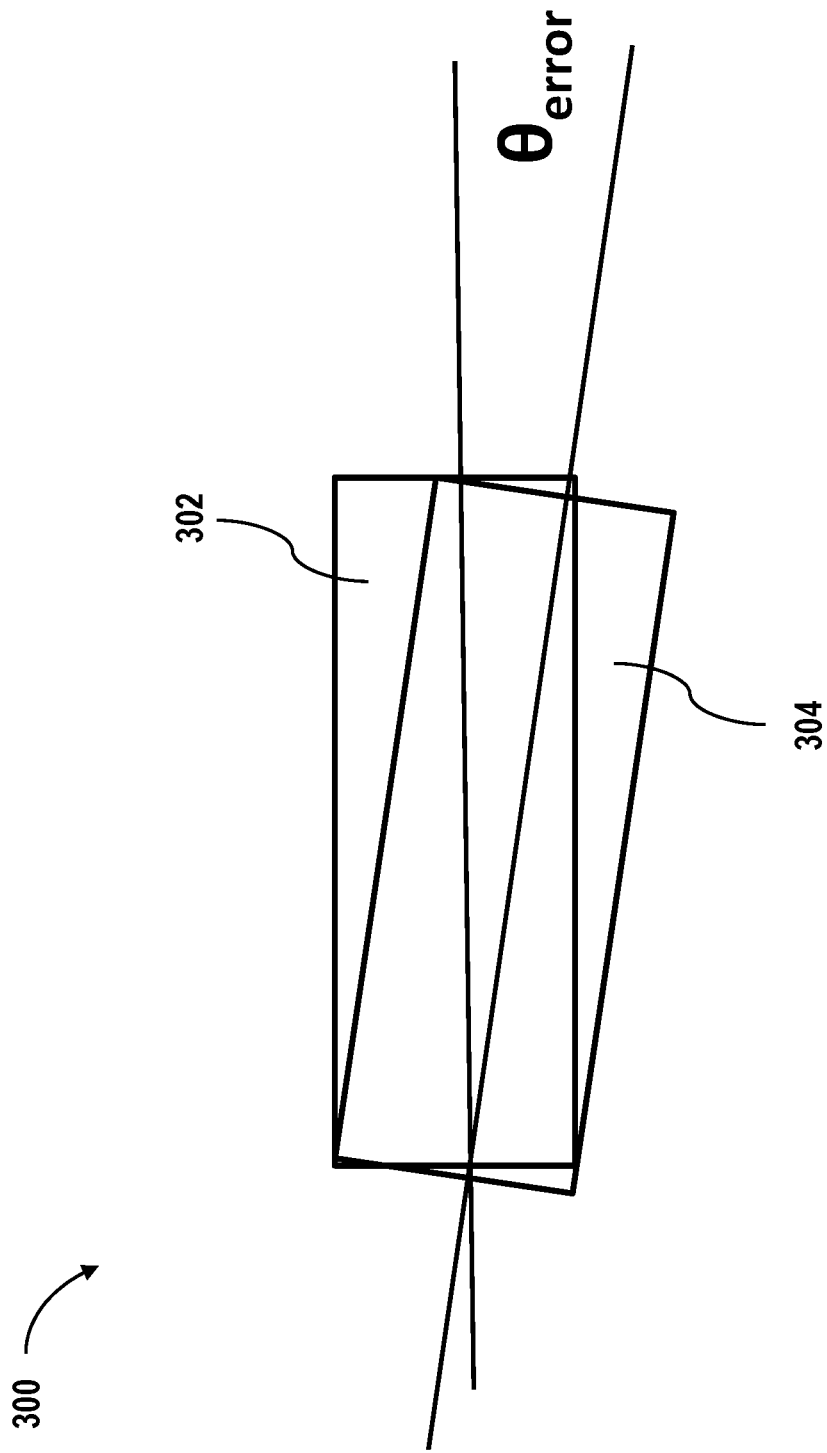
FIG. 8 shows a top schematic view of an electrical connector assembly with an electrical interposer and electrical receptacle that are misaligned, in accordance with certain embodiments of the present disclosure.

FIG. 8 shows a schematic of an electrical connector assembly 300 where an electrical interposer 302 and an electrical receptacle 304 are misaligned, with the misalignment represented by $\theta_{error}$. This misalignment can occur when the electrical interposer 302 and the electrical receptacle 304 are placed in a misaligned arrangement or knocked into a misaligned arrangement before components of the electrical interposer 302 and the electrical receptacle 304 are soldered together. In particular, during the process of soldering the electrical receptacle 304 to the electrical interposer 302, it is difficult to position and maintain that position of the electrical receptacle 304 accurately.

For example, to manufacture one electrical connector assembly like that shown in FIG. 2, the first electrical receptacle 204A may first be positioned together with the electrical interposer 202 which are then baked in an oven to reflow solder to connect to two components. Then, after the solder has reflowed, the second electrical receptacle 204B is positioned together with the electrical interposer 202. The first electrical receptacle 204A, the electrical interposer 202, and the second electrical receptacle 204B are then baked in the oven to reflow the solder connecting the second electrical receptacle 204B to the electrical interposer 202. Throughout this process, the various components can become misaligned. Further, this process would need to be repeated for each separate electrical connector assembly 200.

FIGS. 9-12 show various components to help accurately and simultaneously manufacture multiple electrical connector assemblies 200. The components help position multiple electrical receptacles to an array of electrical interposers and reduce the number of steps to manufacture the electrical connector assemblies 200.

Figure 9:
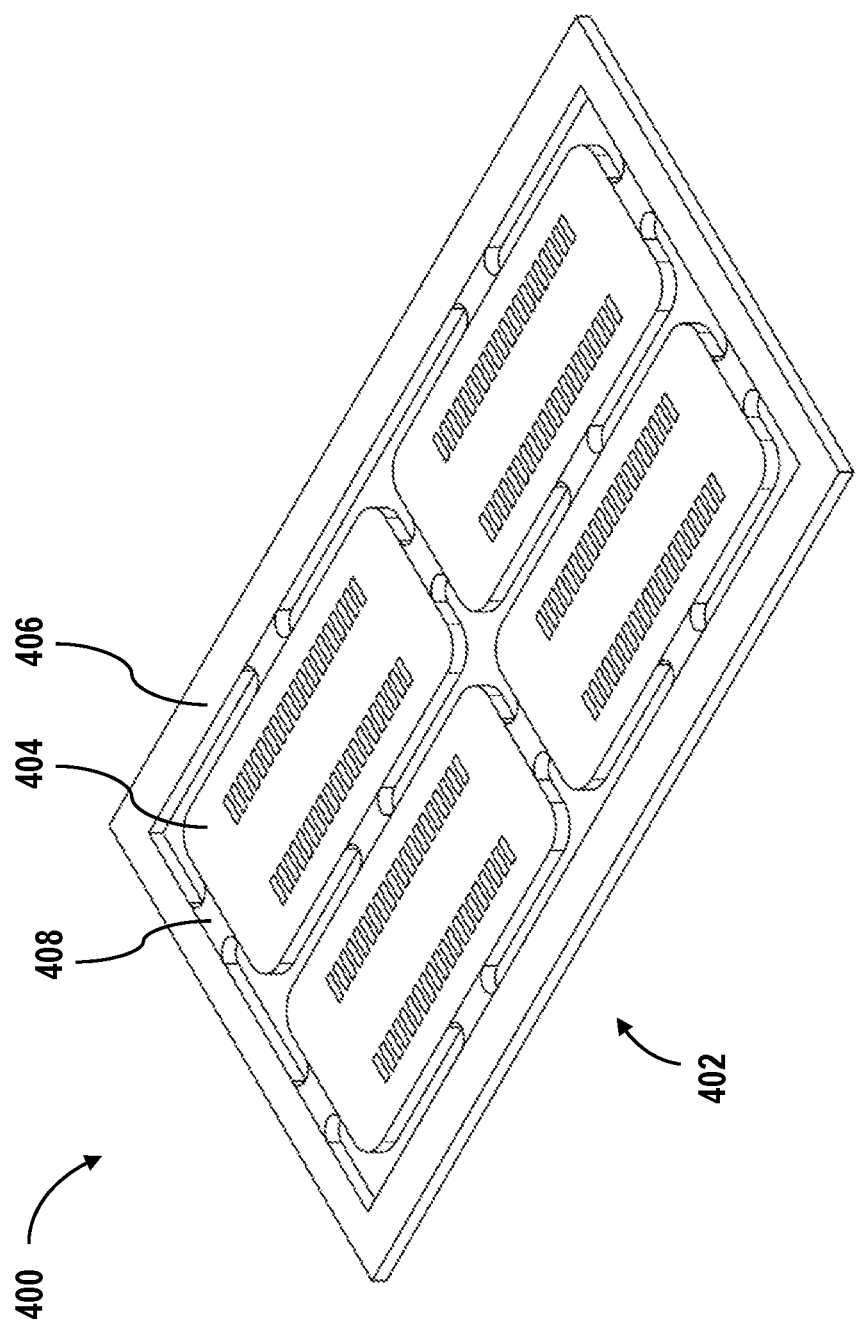
FIG. 9 shows a perspective view of an assembly with an array of electrical interposers, in accordance with certain embodiments of the present disclosure.

FIG. 9 shows a top view of an assembly 400 with an array 402 of electrical interposers 404. Although only four individual electrical interposers 404 are shown in FIG. 9, the array 402 can include fewer or more individual electrical interposers 404. The array 402 of electrical interposers 404 is shown as being positioned within an outer frame 406. The electrical interposers 404 are shown as being coupled to each other or to the outer frame 406 at fixed positions by three or four members 408 (e.g., branch portions).

Figure 10:
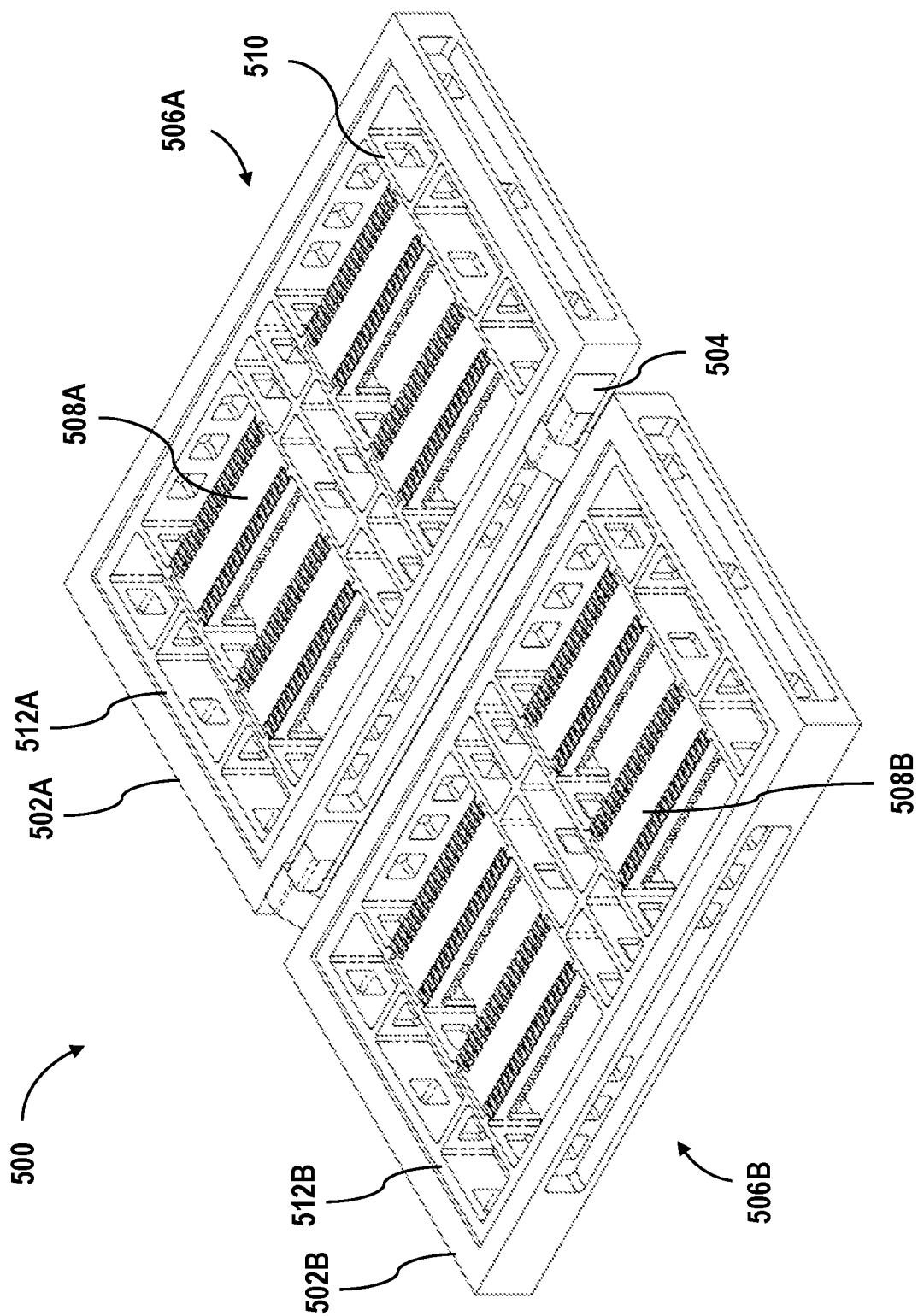
FIGS. 10-12 show perspective views of a fixture at different positions, in accordance with certain embodiments of the present disclosure.

FIG. 10 shows a fixture 500 with first frame 502A and a second frame 502B. The fixture 500 is shown in what can be referred to as the open position of the fixture 500. In certain embodiments, the first frame 502A and the second frame 502B are rotatably coupled to each other by one or more hinges 504. In other embodiments, the first frame 502A and the second frame 502B are separate from each other but can be aligned (e.g., via various alignment members) and coupled to each other during the manufacturing process.

The first frame 502A at least partially surrounds and is coupled to a first array 506A of electrical receptacles 508A. The second frame 502B at least partially surrounds and is coupled to a second array 506B of electrical receptacles 508B. As shown in FIG. 10, the first frame 502A and the second frame 502B can include various wall members 510 (e.g., various inner and outer wall members) some of which are coupled to one or more of the first array 506A of electrical receptacles 508A and some of which are coupled to one or more of the second array 506B of electrical receptacles 508B. The wall members 510 help maintain a position of the first array 506A of electrical receptacles 508A and the second array 506B of electrical receptacles 508B during manufacture of electrical connector assemblies such as those shown in FIG. 2.

One or both of the first frame 502A and the second frame 502B can include a recessed portion 512A and/or 512B. The recessed portion(s) 512A and 512B can be shaped and sized such that the assembly 400 with the array 402 of electrical interposers 404 of FIG. 9 can be positioned within the recessed portion(s) 512A and 512B. For example, the recessed portion(s) 512A and 512B can be shaped so that at least a portion of the outer edges of the assembly 400 can directly contact the walls of the recessed portions(s) 512A and 512B. In embodiments, when only one of the first frame 502A and the second frame 502B includes a recessed portion 512A or 512B, the depth of the recessed portion can be equal to or slightly greater or smaller than a thickness of the outer frame 406 of the assembly 400. In embodiments, when both the first frame 502A and the second frame 502B includes a recessed portion 512A or 512B, the depth of the recessed portions can equal to or slightly greater or smaller than half the thickness of the outer frame 406 of the assembly 400. When the assembly 400 is positioned within the recessed portion(s) 512A and 512B, the position of the assembly 400 can be maintained such that the assembly 400 does not shift or tilt within the fixture 500.

Figure 11:
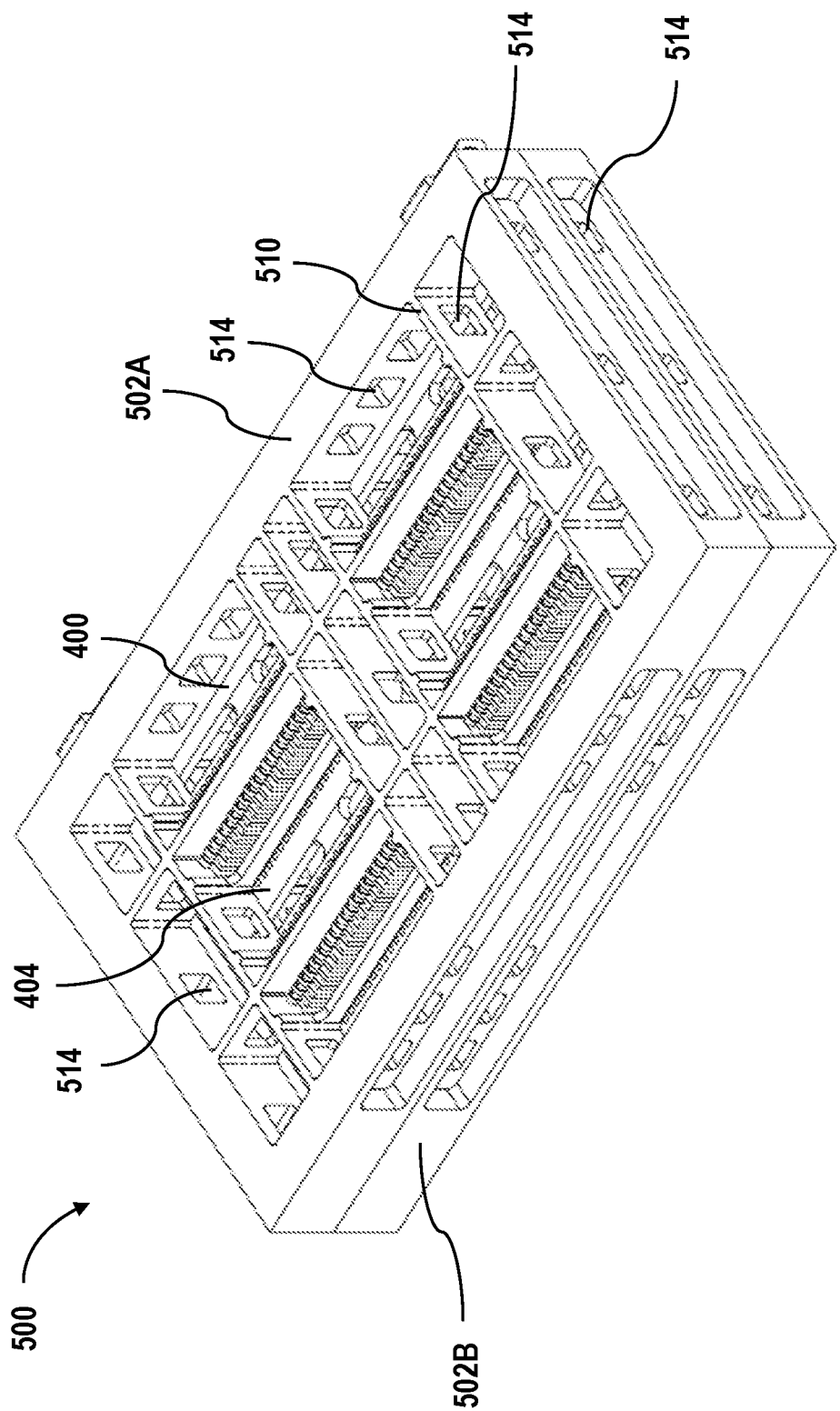

FIG. 11 shows the fixture 500 in what can be referred to as the closed position. Before moving the fixture 500 from the open position to the closed position, the assembly 400 is positioned or placed on the fixture 500. For example, the assembly 400 can be positioned within the one or more recessed portions 512A and 512B. Before the assembly 400 is positioned on the fixture 500, the electrical interposers 404 can be pre-pasted with solder paste at desired locations (e.g., on the conductive pads of the electrical interposers 404).

When the fixture 500 is in the closed position, the assembly 400 is positioned between the first frame 502A and the second frame 502B. The relative position of respective electrical interposers 404 and respective first and second electrical receptacles 508A and 508B are aligned with each other such that the conductive pads of the electrical interposers 404 are aligned with respective electrical conductors of the first electrical receptacle 508A and the second electrical receptacle 508B. Put another way, positioning the fixture 500 to the closed position causes the fixture 500 to align one of the first electrical receptacles 508A and one of the second electrical receptacles 508B with one of the electrical interposers 404.

The fixture 500, in the closed position, along with the assembly 400 can be placed into an oven and baked such that the solder paste reflows and solidifies. As such, the fixture 500 can comprise a material that can withstand oven temperatures—which can range from 20-300 degrees Celsius (e.g., 22-285 degrees Celsius)—and that is dimensionally stable up to at least the upper temperature of the range. The reflowing mechanically and electrically (e.g., conductively) couples the electrical interposers 404 to respective first electrical receptacles 508A and second electrical receptacles 508B. For example, the reflowing of the solder paste mechanically and electrically couples the electrical conductors of the first electrical receptacles 508A and the second electrical receptacles 508B to respective conductive pads of the electrical interposers 404. The components are mechanically and electrically coupled to create individual electrical connector assemblies.

As shown in FIG. 11, in certain embodiments, the first frame 502A, the second frame 502B, and the wall members 510 can include various openings 514 (e.g., through holes). The openings 514 can help avoid impeding the melting of the solder. For example, when the closed fixture 500 is placed in the oven, the openings 514 can allow the heated air to pass through the fixture 500 such that the solder can melt. In certain embodiments, the openings 514 throughout the first frame 502A, the second frame 502B, and the wall members 510 are aligned such that air can enter one side of the fixture 500 and exit the opposite side of the fixture 500. In embodiments, the openings 514 are arranged such that each side of the electrical connector assemblies is exposed to air flow.

Figure 12:
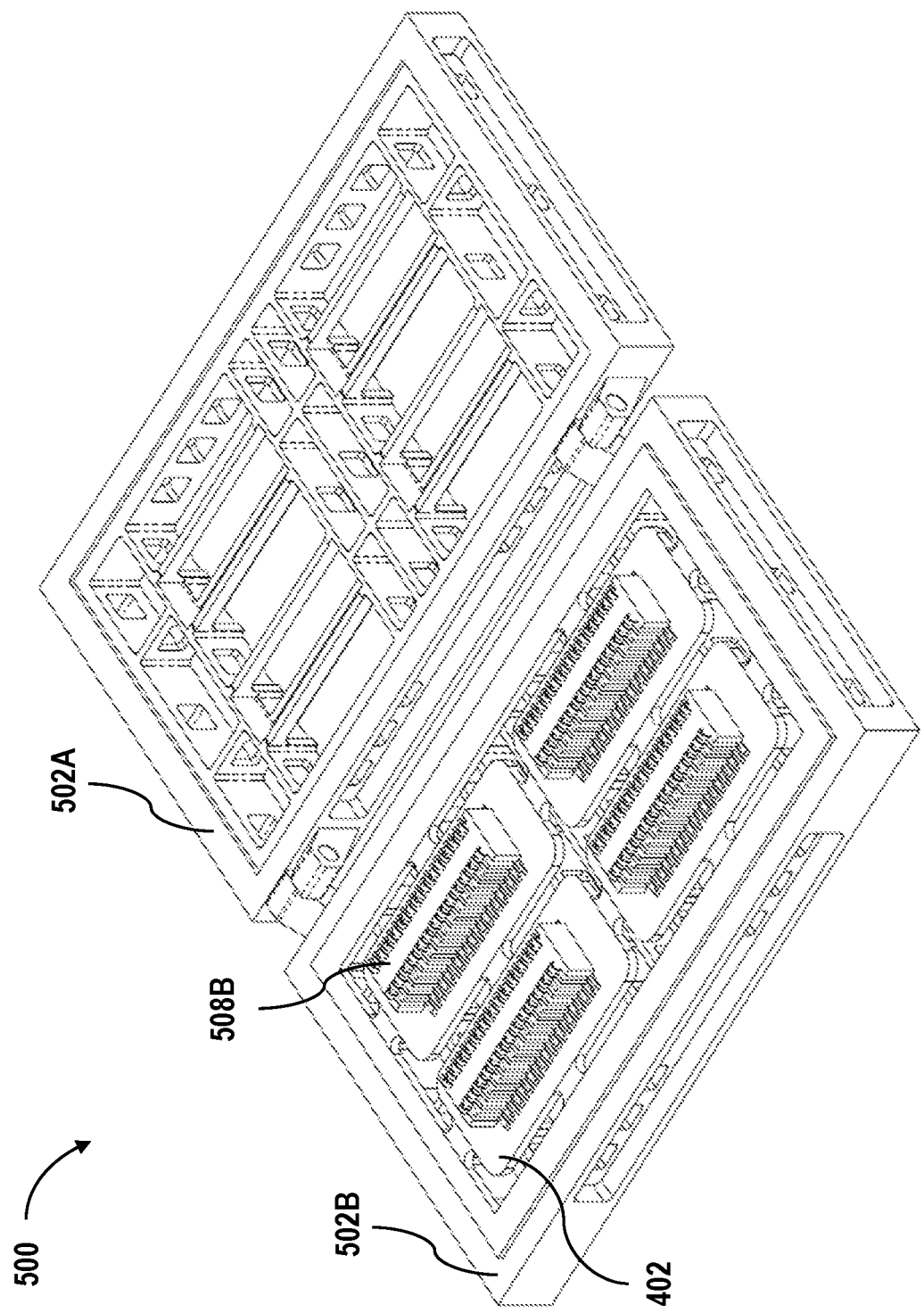

The fixture 500 and the assembly 400 can then be removed from the oven. After removing the fixture 500 and the assembly 400 from the oven, the fixture 500 can be moved to the open position as shown in FIG. 12. FIG. 12 shows that the first electrical receptacles 508A are no longer coupled to the first frame 502A. The first electrical receptacles 508A can be removably coupled to the first frame 502A such that, when the fixture 500 is moved to the open position, the first electrical receptacles 508A can be separated or uncoupled from the first frame 502A. Similarly, the second electrical receptacles 508B can be removably coupled to the second frame 502B such that the second electrical receptacles 508B (and therefore the electrical connector assembly) can be separated or uncoupled from the second frame 502B such that the assembly 400 with the electrical connector assemblies 516 can be removed from the fixture 500.

In certain embodiments, the fixture 500 is re-useable. For example, once one batch of electrical connector assemblies 516 have been removed from the fixture 500, another pair of set of electrical receptacles can be positioned on the respective first frame 502A and second frame 502B and then another assembly with electrical interposers can be positioned on the fixture. The fixture 500 can comprise materials that can withstand the oven temperatures such as materials referred to as delmat materials.

Figure 13:
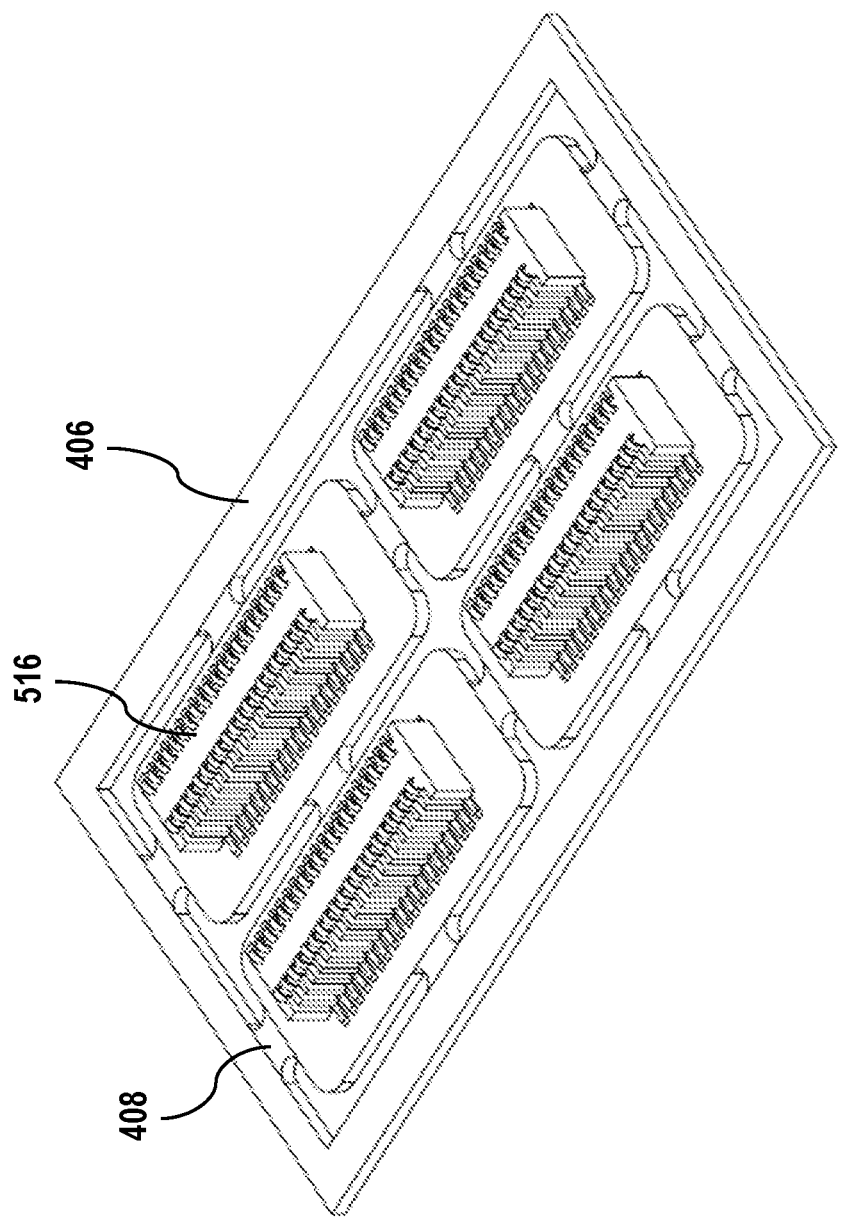
FIG. 13 shows an array of electrical connector assemblies, in accordance with certain embodiments of the present disclosure.

FIG. 13 shows electrical connector assemblies 516 coupled to each other and the outer frame 406 of the assembly 400 via the members 408. After being removed from the fixture 500, the electrical connectors assemblies 516 can be separated from the rest of the remaining assembly 400.

Figure 14:
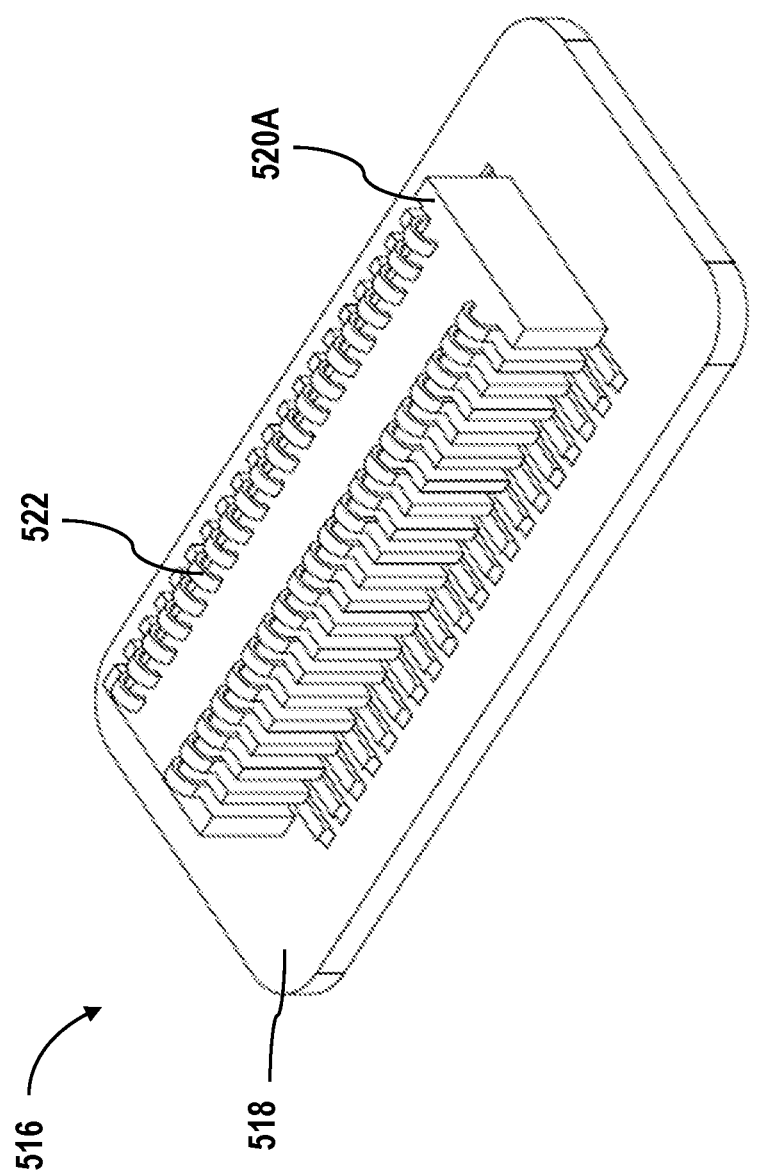
FIG. 14 shows one electrical connector assembly, in accordance with certain embodiments of the present disclosure.

FIG. 14 shows one of the electrical connector assemblies 516 after having been separated from the rest of the remaining assembly 400. Similar to the electrical connector of FIG. 2, the electrical connector assembly 516 includes an electrical interposer 518 coupled to a first electrical receptacle 520A and a second electrical receptacle (not shown in FIG. 14). Both electrical receptacles have conductive elements 522 (e.g., conductive pins) that—after having the solder reflowed—are mechanically and conductively coupled to respective conductive pads (not shown in FIG. 14) of the electrical interposer 518. Once the electrical connector assemblies 516 are separated, each electrical connector assembly 516 can be coupled to a base deck of a hard disk drive or installed in a different type of device needing an electrical connector.

Figure 15:
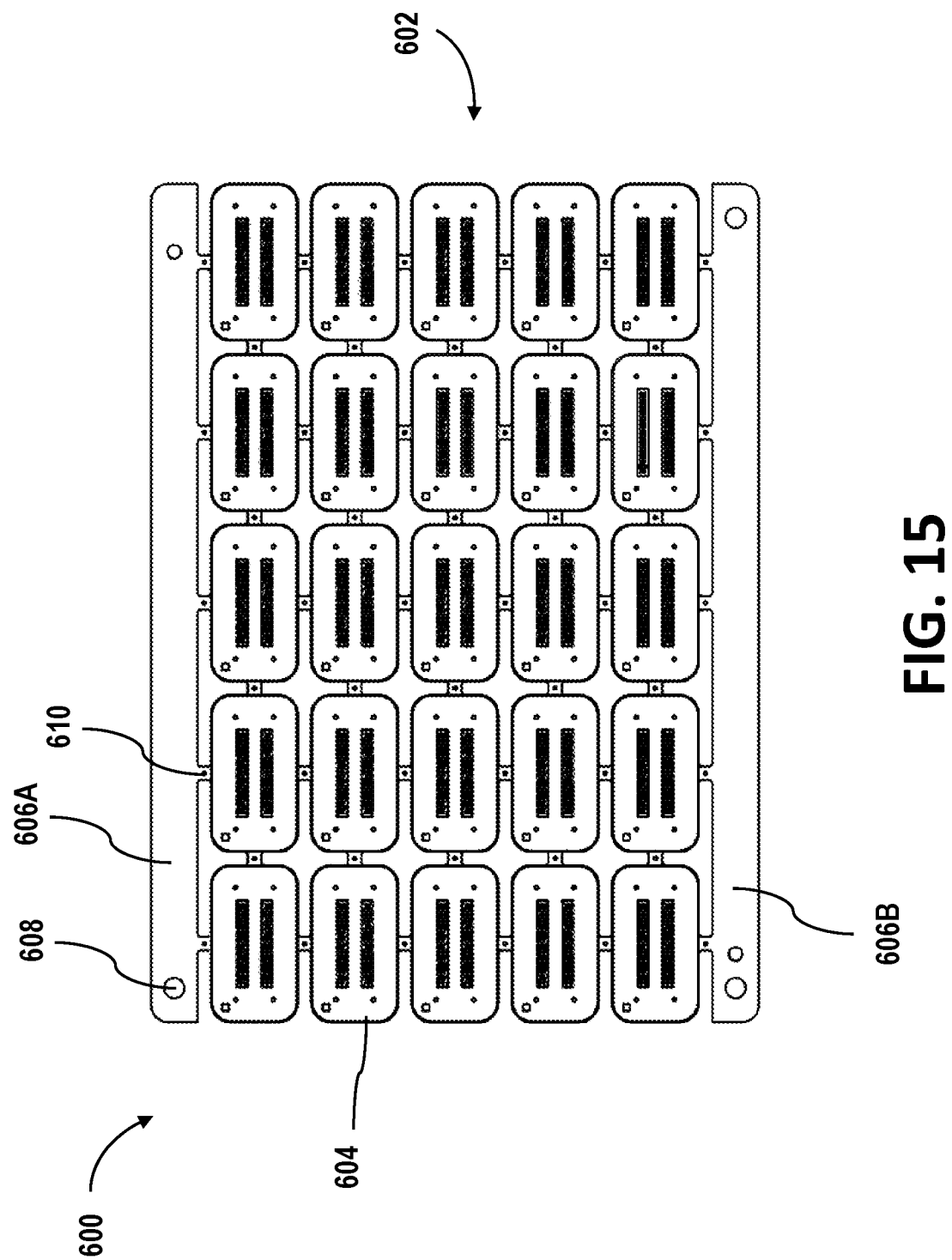
FIG. 15 shows a top view of an assembly with an array of electrical interposers, in accordance with certain embodiments of the present disclosure.

FIG. 15 shows a top view of another example of an assembly 600 with an array 602 of electrical interposers 604. In the embodiment shown in FIG. 15, the assembly 600 includes 20 electrical interposers 604.

The array 602 of electrical interposers 604 is shown as being positioned between a first handling portion 606A and a second handling portion 606B. The first handling portion 606A and the second handling portion 606B can include holes 608 (e.g., alignment thru holes) at various positioned along the assembly 600. The holes 608 can help align the assembly 600 with a fixture. The electrical interposers 604 are shown as being coupled to each other or to the first and second handling portions 606A and 606B at fixed positions by three or four members 610. Like the assembly 400 of FIG. 9, the assembly 600 can be coupled to a fixture that aligns electrical receptacles with the electrical interposers and maintains the respective positions while solder is reflowed.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A method for manufacturing electrical connector assemblies, which each include an electrical interposer and a first electrical receptacle, the method comprising:
    positioning a fixture coupled to or including an array of the first electrical receptacles such that each of the first electrical receptacles aligns with one of the electrical interposers on an assembly with an array of the electrical interposers, wherein the positioning the fixture includes rotating the fixture from an open position to a closed position around a hinge; and
    reflowing solder to mechanically and electrically couple the array of the first electrical receptacles to the array of the electrical interposers.

2. The method of claim 1, wherein the reflowing the solder includes mechanically and electrically coupling electrical conductors of the first electrical receptacles to conductive pads of the electrical interposers.

3. The method of claim 1, wherein the fixture includes a first frame coupled to or including the array of the first electrical receptacles and a second frame coupled to or including an array of second electrical receptacles, the method further comprising:
    positioning the assembly on the second frame to align the electrical interposers with the array of the second electrical receptacles.

4. The method of claim 3, further comprising:
    reflowing solder to mechanically and electrically couple the array of the second electrical receptacles to the array of the electrical interposers.

5. The method of claim 4, further comprising:
    baking the fixture and the assembly in an oven.

6. The method of claim 5, wherein after the baking, one of the first electrical receptacles and one of the second electrical receptacles are each coupled to one of the electrical interposers to create separate electrical connector assemblies.

7. The method of claim 6, further comprising:
    separating the electrical connector assemblies from the fixture.

8. The method of claim 7, further comprising:
    coupling each one of the electrical connector assemblies to a base deck of a hard disk drive.

9. The method of claim 1, wherein the fixture includes a first frame coupled to or including the array of the first electrical receptacles and a second frame coupled to or including an array of second electrical receptacles, wherein the first frame includes only four of the first electrical receptacles, wherein the second frame includes only four of the second electrical receptacles.

10. The method of claim 1, wherein the fixture is re-useable.

11. A method for manufacturing electrical connector assemblies, which each include an electrical interposer, a first electrical receptacle, and a second electrical receptacle, the method comprising:
    positioning a fixture coupled to or including an array of the first electrical receptacles such that each of the first electrical receptacles aligns with one of the electrical interposers on an assembly with an array of the electrical interposers, wherein the fixture includes a first frame coupled to or including the array of the first electrical receptacles and a second frame coupled to or including an array of the second electrical receptacles;
    positioning the assembly on the second frame to align the electrical interposers with the array of the second electrical receptacles; and
    reflowing solder to couple the array of the first electrical receptacles and the second electrical receptacles to the array of the electrical interposers.

12. The method of claim 11, further comprising:
    baking the fixture and the assembly in an oven.

13. The method of claim 12, wherein after the baking, one of the first electrical receptacles and one of the second electrical receptacles are each coupled to one of the electrical interposers to create separate electrical connector assemblies.

14. The method of claim 11, wherein the method creates four to twenty electrical connector assemblies.

15. The method of claim 11, wherein the fixture is re-useable.

16. The method of claim 11, wherein the positioning the fixture includes rotating the fixture from an open position to a closed position around a hinge.

17. The method of claim 11, wherein the reflowing solder mechanically couples the array of the first electrical receptacles and the second electrical receptacles to the array of the electrical interposers.

18. The method of claim 17, wherein the reflowing solder electrically couples the array of the first electrical receptacles and the second electrical receptacles to the array of the electrical interposers.

19. The method of claim 1, wherein the method creates four to twenty electrical connector assemblies.

* * * * *